United States Patent
Bogoni

(10) Patent No.: US 7,705,993 B2
(45) Date of Patent: Apr. 27, 2010

(54) SAMPLING OF OPTICAL SIGNALS

(75) Inventor: Antonella Bogoni, Mantova (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 68 days.

(21) Appl. No.: 11/969,253

(22) Filed: Jan. 4, 2008

(65) Prior Publication Data
US 2008/0164863 A1 Jul. 10, 2008

(30) Foreign Application Priority Data
Jan. 4, 2007 (EP) .................................. 07050083

(51) Int. Cl.
*G01B 9/02* (2006.01)
(52) U.S. Cl. ...................... 356/484; 356/450
(58) Field of Classification Search ................ 356/73.1, 356/450, 477, 484; 324/96; 372/21
See application file for complete search history.

(56) References Cited

U.S. PATENT DOCUMENTS

| 7,199,870 | B2 * | 4/2007 | Andrekson et al. ......... 356/73.1 |
| 2006/0018006 | A1 * | 1/2006 | Watanabe ................... 359/332 |
| 2006/0159463 | A1 * | 7/2006 | Futami et al. ............... 398/152 |

OTHER PUBLICATIONS

Meloni, G. et al. "Sub-ps Resolution Sampler Based on FWM Effect in Highly Non-Linear Fibre." Proceedings of the International Society for Optical Engineering—Wave and Terahertz Photonics, vol. 6194, May 2006. XP-002452452.

Westlund, M. et al. "Fiber-Based All-Optical Sampling System with Simultaneous -17 dBm Sensitivity, 1 ps Temporal Resolution and 60 nm Optical Bandwidth." Optical Fiber Communication Conference, Technical Digest, Mar. 2005, pp. 223-225. XP-010831704.

Andrekson, P. A. "Picosecond Optical Sampling using Four-Wave Mixing in Fibre." Electronics Letters, vol. 27, No. 16, August 1, 1991, pp. 1440-1441. XP-002452453.

Bogoni, A. et al. "Modeling and Measurement of Noisy SOA Dynamics for Ultrafast Applications." IEEE Journal on Selected Topics in Quantum Electronics, vol. 10, No. 1, Jan./Feb. 2004, pp. 197-205.

Jungerman, R. L. et al. "1-THz Bandwidth C- and L-Band Optical Sampling with a Bit Rate Agile Timebase." IEEE Photonics Letters, vol. 14, No. 8, Aug. 2002, pp. 1148-1150.

Li, J. et al. "0.5=Tb/s Eye-Diagram Measurement by Optical Sampling Using XPM-Induced Wavelength Shifting in Highly Nonlinear Fiber." IEEE Photonics Letters, vol. 16, No. 2, Feb. 2004, pp. 566-568.

(Continued)

*Primary Examiner*—Michael A Lyons
(74) *Attorney, Agent, or Firm*—Coats & Bennett, P.L.L.C.

(57) ABSTRACT

A method and device for sampling ultra-fast optical signals by generating a sampling signal comprising a train of short pulses and coupling the sampling signal together with an optical data signal to be sampled into a highly non-linear optical fiber. Four-wave mixing (FWM) occurs between the two signals resulting in a secondary signal output from the fiber consisting of pulsed components having energy proportional to the instantaneous power of points along the data signal. An analysis of this secondary signal can be carried out to create a normal trace or eye-diagram of the data signal.

26 Claims, 2 Drawing Sheets

OTHER PUBLICATIONS

Meloni, G. et al "Real-Time PS-Resolution Optical Sampler Based on XPM-Induced Polarization Rotation in 1-Meter-Long Bismuth Oxide Fibre." 31st European Conference on Optical Communication, 2005, Sep. 25-29, 2005, vol. 1, pp. 63-64.

Shake, I. et al. "Simple Q Factor Monitoring for BER Estimation Using Opened Eye Diagrams Captured by High-Speed Asynchronous Electrooptical Sampling." IEEE Photonics Letters, vol. 15, No. 4, Apr. 2003, pp. 620-622.

Thomsen, B. C. et al. "Characterization of a 10 GHz Harmonically Mode-Locked Erbium Fiber Ring Laser using SHG FROG." Summaries of Papers Presented at the Conference on Lasers and Electro-Optics, 1999, Baltimore, MD, May 23-28, 1999, pp. 103-104.

* cited by examiner

SAMPLING OF OPTICAL SIGNALS

RELATED APPLICATIONS

This application claims priority from a foreign patent application having serial number PCT/EP2007/050083. That application, which is entitled "Improvements in or Relating to the Sampling of Optical Signals," was filed on Jan. 4, 2007, and is incorporated herein by reference in its entirety.

BACKGROUND

This invention relates to improvements in or relating to the sampling of optical signals and, in particular, but not especially, a device and a method for sampling ultra-fast (ultra-high frequency) optical signals, such as C-band (3.7 to 4.2 GHz) signals, by achieving picosecond resolution.

The need to sample ultra-fast optical signals having ultra-short pulses is rapidly increasing, being of interest in a large number of applications, such as ultra-fast communications, biophotonics, sensing, large system synchronisation, dynamic characterisation and testing of new materials. To date, various optical sampling techniques have been proposed to sample ultra-fast optical signals.

One such technique is the Frequency Resolved Optical Gate (FROG). This is the only technique that can describe both amplitude and phase of an optical signal and does not require any synchronisation circuitry. However, it is a very complex technique and requires a long processing time. In particular, FROG requires a spectrometer to obtain the whole spectrum of the secondary signal obtained from the interaction of an optical signal to be sampled and its delayed replica. Consequently, the amount of data to be processed is large and can take a long time, making the sampling process very slow. Moreover, processing of the secondary signal involves the determination of an integral. However, in certain cases, the integral does not converge, preventing the processing of the secondary signal.

Other techniques require a clock recovery system to synchronise the pulses of the optical sampling signal with the optical signal to be sampled. If the repetition rate is very high, the development of a suitable clock recovery system for synchronisation is critical and can be very expensive. Furthermore, these techniques can typically only analyse limited time intervals, therefore they only allow one to resolve the eye-diagram of an optical data signal not the long bit sequences. Other optical sampling techniques carry out asynchronous sampling, using very high-speed electronics for the generation of a sampling gate. However, besides suffering from the disadvantage of requiring complex and costly electronics, the resolution is limited to tens of picoseconds.

SUMMARY

According to a first aspect of the invention there is provided a method for sampling an optical signal comprising:— originating an optical sampling signal;

passing the optical signal and optical sampling signal through a non-linear optical medium such that the two signals interact to generate a secondary signal having pulsed components proportional to the instantaneous power of the optical signal; and detecting the secondary signal.

It will be understood that the term "originating" as used herein means that the optical sampling signal is not derived from the optical signal; for example, the optical sampling signal is not generated by dividing the optical signal into two parts or replicating the optical signal.

The method of the invention can achieve picosecond resolution allowing the sampling of ultra-fast optical signals. However, advantageously, there is no need for synchronising the optical signal with the optical sampling signal and therefore, the use of a complex and/or expensive electronics can be avoided. Furthermore, analysis of the detected secondary signal can be simply achieved. In particular, during processing, only the instantaneous power of the secondary signal has to be determined, not the whole spectrum. This reduces the amount of data, increasing processing speed such that refresh times of less then 1 second can be achieved.

The non-linear medium provides appropriate conditions for the interactions, such as four-wave mixing (FWM), such that a suitable secondary signal is attained. A suitable non-linearity for the medium is between 5 to 40 $W^{-1}km^{-1}$, preferably, 10 $W^{-1}km^{-1}$. Photonic crystal fibres or bismuth-oxide base fibres can have a non-linear coefficients above 40 $W^{-1}km^{-1}$, however, they tend to have undesirable characteristics in terms of chromatic dispersion and polarization dispersion that make these types of fibres unsuitable.

Since the sampling signal is generated independently of the optical signal and there is no synchronisation circuitry (clock recovery system), the frequencies of the optical sampling signal and the optical signal are not correlated. Therefore, consecutive pulsed components generated by the interaction of the signals do not correspond to consecutive instantaneous power values of a period of the optical signal. Accordingly, if one wants to determine the shape of a period of the optical signal from the secondary signal (i.e. the result of the interaction), one may have to re-order the pulsed components of the secondary signal. Accordingly, the method may comprise determining an order of the pulsed components of the secondary signal that represents the shape of a period of the optical signal. The order of any one of the pulsed components may be determined using the formula:

$$t_i = t_0 + \text{Mod}\left[i\frac{(T_S - T_C)}{T_S}\right]$$

where i is the $i^{th}$ pulsed component of the secondary signal after time, $t_0$, $T_S$ the time period for the optical signal and $T_C$ the time period for the optical sampling signal. The method may comprise placing the pulsed components in the order determined.

The optical sampling signal may comprise a train of pulses. In this way, when the optical sampling signal interacts with the optical signal, the pulses "pick-out" the instantaneous power at respective points in the optical signal. Ideally, the pulses would be delta functions, i.e. have no width, however in reality this is not possible. Preferably, the pulses have a width of less than 40 ps, even more preferably, less than 10 ps. The shorter the pulse width the better defined are the corresponding pulsed components of the secondary signal, and therefore the better the resolution that can be achieved. In order to achieve less than picosecond resolution it has been found that a pulse width of 1 ps is acceptable.

The difference between the length of the time periods (frequencies) of the optical signal and the frequency of the pulses of the optical sampling signal ($T_S$-$T_C$) also affects the resolution. For sampling optical signals having a frequency of pulses of a few Gbit/s, the frequency of the optical sampling signal should by of the order of hundreds of MHz, typically 500 MHz. The method may comprise tuning the frequency of the pulses of the optical sampling signal to change the resolution. Tuning the frequency of the pulses of the optical sampling signal may comprise varying the length of a fibre cavity of a laser that generates the optical sampling signal. The length of the fibre cavity may be altered with a laser having a variable optical delay line. For example, for an optical sampling signal comprising a frequency of pulses of 500 MHz, a variable fibre cavity can be provided that alters the frequency by +/−1.5 MHz. Finely tuning the frequency of pulses of the optical sampling signal allows one to significantly improve the resolution.

Detecting the secondary signal may comprise filtering the secondary signal at a filtering wavelength, $\lambda_{FWM}$, substantially equal to a wavelength of a FWM component produced by the interaction. The filtering wavelength, $\lambda_{FWM}$, may be a wavelength that selects the FWM component that is closest to the wavelength of the sampling signal. This ensures that the energy of the pulsed components of the secondary signal produced by the interaction is substantially linearly dependent on the power of the optical signal.

According to a second aspect of the invention there is provided a device for sampling an optical signal comprising:
an input for receiving an optical signal;
means for originating an optical sampling signal;
means for coupling the optical signal received at the input and the optical sampling signal into a non-linear optical medium such that the two signals interact in the medium to generate a secondary signal having pulsed components proportional to the instantaneous power of the optical signal; and
a detector for detecting the secondary signal.

The means for originating the optical sampling signal may be a laser. In one arrangement, the laser generates a signal comprising a train of pulses having a first frequency. The means for originating the sampling signal may further comprise a modulator for reducing the frequency of pulses to a second frequency. For example, the laser may produce a signal having a frequency of pulses of 10 GHz and the modulator may reduce the frequency to 500 MHz. In this way, electronics having a narrower bandwidth can be used to receive the secondary signal for processing, which can reduce costs.

The laser may be adjustable to alter the frequency of pulses generated by the laser. The laser may be adjustable to vary the wavelength of the generated signal. In this way, the device can be adjusted dependent on the optical signal being sampled.

Alternatively, the means for originating the sampling signal may be a further input for receiving the sampling signal from an external source.

The optical medium may be a Highly Non-Linear fibre (HNFL). A long HNFL is suitable for generating the interaction effects, such as FWM, that are necessary to sample the signal.

The device may comprise a filter for filtering the secondary signal at a filtering wavelength, $\lambda_{FWM}$, substantially equal to a wavelength of a FWM component produced by the interaction. The filtering wavelength, $\lambda_{FWM}$, may be a wavelength that selects the FWM component that is closest to the wavelength of the sampling signal. The filter may be tunable to select the appropriate wavelength.

According to a third aspect of the invention there is provided an oscilloscope comprising a device according to the second aspect of the invention.

According to a fourth aspect of the invention there is provided a computer readable medium providing instructions that when executed by a processor of a computer cause the processor to receive a signal having pulsed components, receive data on a time period, $T_S$, of an optical signal, receive data on the time period, $T_C$, of a sampling signal, and determine an order of the pulsed components which represents a period of the optical signal using the formula, $$t_i = t_0 + \mathrm{Mod}\left[i\frac{(T_S - T_C)}{T_S}\right],$$

where i is the i$^{th}$ pulsed component of the received signal from time, $t_o$.

An embodiment of the invention will now be described, by example only, with reference to the drawings, in which.

DETAILED DESCRIPTION

Figure 1:
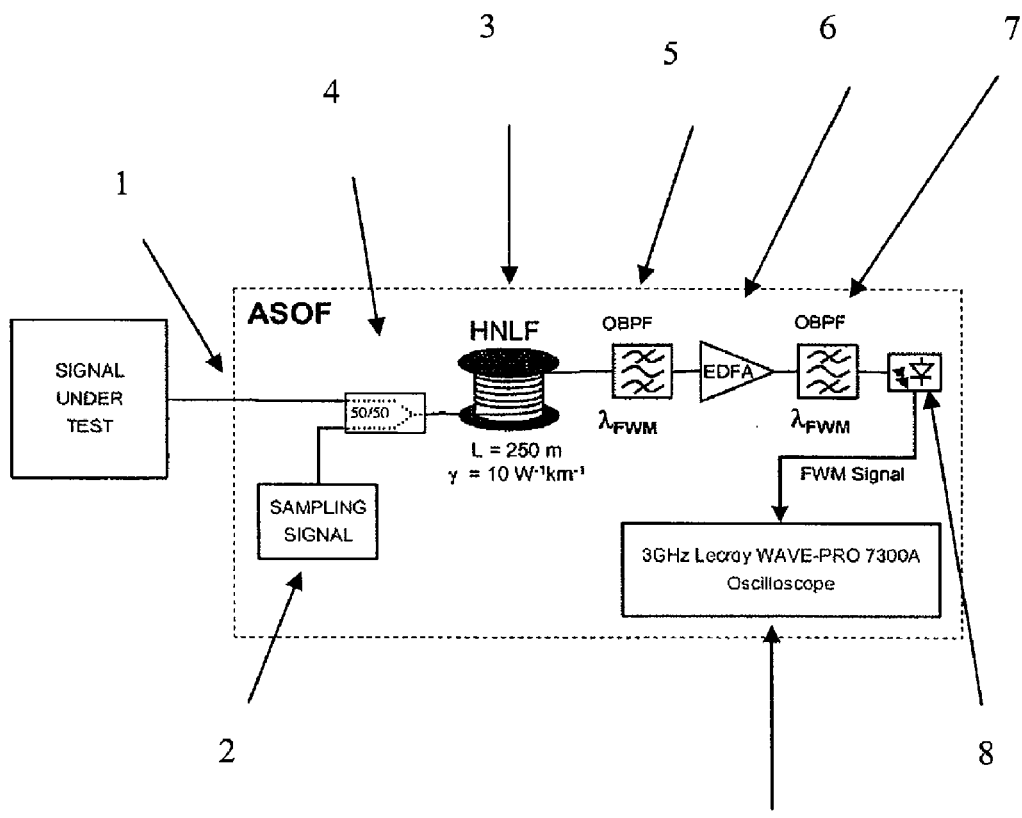
FIG. 1 shows a schematic view of an asynchronous optical sampling oscilloscope (ASOF) configured according to one embodiment of the present invention.

Now referring to FIG. 1, an ASOF configured according to one embodiment of the present invention comprises an input 1 for receiving an optical signal to be sampled and means 2 for generating an optical sampling signal. In this embodiment, the means 2 is a 10 GHz Actively Mode-Locked laser (AMLFL) for generating a signal having 1 ps pulses at a tunable wavelength, $\lambda_C$, and a Mach Zehnder modulator for modulating the generated signal to reduce the frequency of the pulses to 500 MHz. The mean power of the sampling signal is set around −4 dB.

The accuracy of the ASOF depends on the stability of the frequencies of the optical signal to be sampled and the optical sampling signal. The AMLFL 2 used in this embodiment has a stability of 0.5 MHz, the stability defined as the standard deviation around the nominal frequency of 500 MHz. The AMLFL may comprise a variable optical delay line to alter the length of the lasing cavity to allow fine tuning of the frequency of pulses in the sampling signal. Typically, a range of 500 MHz+/−1.5 MHz can be achieved.

The sampling signal and the optical signal are coupled into a 250 m long span of highly non-linear fibre 3 by a combiner (optical diplexer) 4. Typically the fibre 3 will have a non-linearity, γ, of 10 W$^{-1}$km$^{-1}$, which is suitable to achieve the desired FWM interaction between the optical signal and sampling signal in the fibre 3. The FWM of the two signals in the fibre 3 produces a secondary signal exiting the fibre 3 having pulsed components, as explained in more detail with reference to FIG. 2.

The secondary signal is filtered by a tunable optical bandpass filter 5 that can be adjusted to select a filtering wavelength $\lambda_{FWM}$. Typically, the filter will have a 3 db bandwidth of 2.5 nm. The wavelength, $\lambda_{FWM}$, of the filter 5 is set to select the FWM component of the secondary signal that is closest to the wavelength $\lambda_C$ of the sampling signal. The FWM component closest to the wavelength of the sampling signal has the greatest intensity of all the FWM components.

Figure 3:
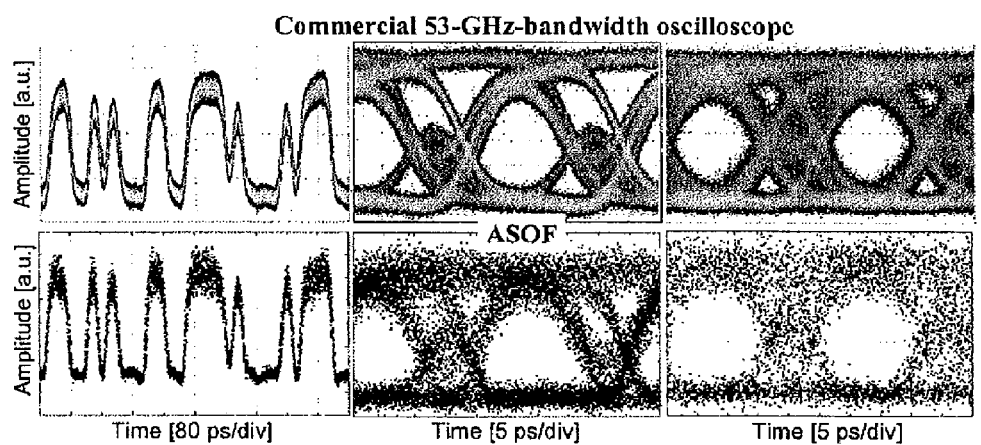
FIG. 3 shows examples of sampling performed on an optical data signal by a commercial oscilloscope, and by an oscilloscope configured according to one embodiment of the present invention.

The filtered secondary signal is then amplified by an Erbium Doped Fibre Amplifier (EDFA) 6, filtered by a further bandpass filter 7 which removes noise introduced by the EDFA 6 and detected by a photodetector 8 having 1 GHz bandwidth. The photodetector 8 is connected to a 3 GHz bandwidth oscilloscope 9 working at 10 Gsamples/s. The oscilloscope 9 used to obtain the results shown in FIG. 3 is a Lecroy WAVEPRO 7300A, which is able to directly acquire and process a large amount of data and can be programmed to process the data exploiting MatLab scripts. However, it will be understood that other suitable oscilloscopes may be used. The main requirements of the oscilloscope is that it has a bandwidth that is higher than the sampling signal frequency, while able to acquire a large number of samples, while presenting a short processing time.

Figure 2:
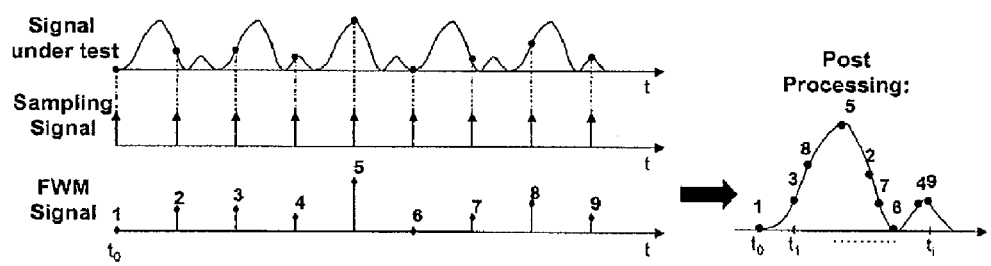
FIG. 2 shows graphs indicating representations of optical signals processed according to one embodiment of the present invention.

FIG. 2 illustrates the working principle of the ASOF of the invention. The upper graph illustrates the optical signal to be sampled, which has a periodic signal having a frequency, $f_S$. The sampling signal, illustrated by the middle graph, comprises a train of ultra-short pulses having a frequency, $f_C$. When the signals pass through the fibre 3, FWM occurs generating a secondary signal; each pulse of the sampling signal interacts with a corresponding part of the optical signal to generate a pulsed component of the secondary signal whose energy is proportional to the instantaneous power of that part of the optical signal. The resultant secondary signal is illustrated by the lower graph of FIG. 2.

Since the frequencies of the optical signal and the sampling signal are not correlated (i.e. synchronised), consecutive pulsed components of the secondary signal do not correspond to consecutive power values of a single period of the optical signal, e.g. the $4^{th}$ pulsed component is a later power value in a period of the data signal than the $5^{th}$ pulsed component. Therefore, in order to reconstruct the shape of a period of the optical signal, the position, $t_i$, of the pulsed components on a period of the data signal has to be determined. This is achieved with the following formula:

$$t_i = t_0 + \text{Mod}\left[i\frac{(T_S - T_C)}{T_S}\right],$$

where i is the $i^{th}$ pulsed component of the secondary signal from time, $t_0$, $T_S$ is the length of a period of the optical signal and $T_C$ is the length of a period of the sampling signal.

In order to demonstrate the effectiveness of the ASOF according to the invention, FIG. 3 shows conventional views and an eye-diagram of a bit long sequences as resolved by a 53 GHz commercial oscilloscope and an ASOF according to the invention. The top views are those produced by the commercial oscilloscope and the bottom views those produced by the ASOF. The two views on the left are a 32 bit sequence as visualised by each oscilloscope. The central views are the eye-diagrams for the 32 bit sequence. The views on the right are the eye-diagrams for a $(2^{31}-1)$ pseudo-random bit sequence.

Figure 4:
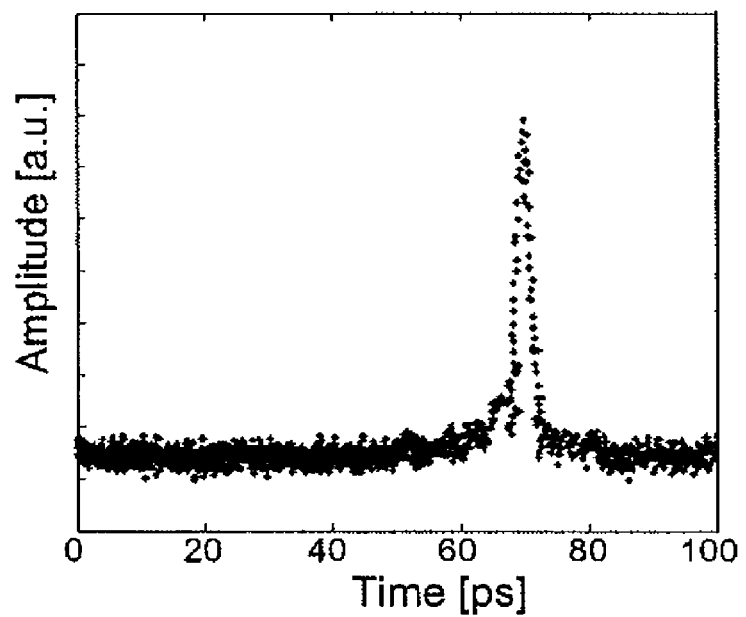
FIG. 4 shows an exemplary trace of 4 ps optical pulses as sampled by an oscilloscope configured according to one embodiment of the present invention.

As can be appreciated from FIG. 3, the ASOF is better for resolving the isolated ones and zeros then the commercial oscilloscope. Moreover, the eye-diagrams for the ASOF are more open than the eye-diagrams for the commercial oscilloscope illustrating the higher bandwidth of the ASOF. The resolution of the ASOF is also illustrated in FIG. 4. This Figure illustrates a 1561 nm optical data signal comprising a 10 GHz train of pulses. The trace of the pulses acquired by the ASOF has a resolution of approximately 0.26 ps. The ASOF measures a pulse width of 4.2 ps, very close to the 4 ps estimated by a commercial autocorrelator.

Accordingly, as will be appreciated, the ASOF of the invention provides a device for sampling ultra-fast signals with picosecond resolution. However, the ASOF avoids the need for a clock recovery circuit while able to resolve both bit sequence and eye-diagram of a signal. Furthermore, the settings of the ASOF can be changed to adapt the ASOF to different applications.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method for sampling an optical signal comprising:
generating an optical sampling signal;
passing the optical signal and the generated optical sampling signal through a non-linear optical medium such that the optical signal and the optical sampling signal interact to generate a secondary signal having pulsed components proportional to an instantaneous power of the optical signal;
detecting the secondary signal;
determining an order of the pulsed components of the secondary signal that represents a shape of a period of the optical signal; and
re-ordering the pulsed components by placing the pulsed components in the order determined.

2. The method of claim 1 wherein the order of any one of the pulsed components is determined using the formula:

$$t_i = t_0 + \text{Mod}\left[i\frac{(T_S - T_C)}{T_S}\right]$$

where $t_0$ is the time of the pulsed components of the secondary signal that is to be considered;
where i is the number of the $i^{th}$ pulsed component since $t_0$ whose position on the period of the optical signal is being determined;
where TS is the time period for the optical signal; and
where TC is the time period for the sampling signal.

3. The method of claim 1 wherein the non-linear optical medium has a non-linearity of more than 5 $W^{-1}m^{-1}$.

4. The method of claim 1 wherein the interaction between the optical signal and the optical sampling signal includes four-wave mixing (FWM).

5. The method of claim 1 wherein detecting the secondary signal comprises filtering the secondary signal at a filtering wavelength, $\lambda_{FWM}$, that is substantially equal to a wavelength of a FWM component produced by the interaction of the optical signal and the optical sampling signal.

6. The method of claim 5 wherein the filtering wavelength, $\lambda_{FWM}$, comprises a wavelength that is substantially equal to a wavelength of the FWM component that is closest to the wavelength of the optical sampling signal.

7. A method for sampling an optical signal comprising:
generating an optical sampling signal, wherein the optical sampling signal comprises a train of pulses;
passing the optical signal and the generated optical sampling signal through a non-linear optical medium such that the optical signal and the optical sampling signal interact to generate a secondary signal having pulsed components proportional to an instantaneous power of the optical signal;

detecting the secondary signal; and tuning a frequency of the pulses of the optical sampling signal to change a resolution.

8. The method of claim 7 wherein the pulses have a width of less than 40 ps.

9. The method of claim 8 wherein the pulses have a width of less than 10 ps.

10. The method of claim 9 wherein the pulses have a width of about 1 ps.

11. The method of claim 7 wherein the frequency of the pulses is about 500 MHz.

12. The method of claim 7 wherein tuning the frequency of the pulses of the optical sampling signal comprises varying a length of a fibre cavity of a laser that generates the optical sampling signal.

13. A device for sampling an optical signal comprising:
an input configured to receive an optical signal;
an optical signal generator configured to generate an optical sampling signal;
a coupler configured to couple the optical signal received at the input and the optical sampling signal to a non-linear optical medium, such that the optical signal and the optical sampling signal interact in the non-linear optical medium to generate a secondary signal having pulsed components proportional to an instantaneous power of the optical signal;
a detector configured to detect the secondary signal; and
a processor configured to:
determine an order of the pulsed components of the secondary signal that represents a shape of a period of the optical signal; and
re-order the pulsed components by placing the pulsed components in the determined order.

14. The device of claim 13 wherein the optical signal generator comprises a laser.

15. The device of claim 14 wherein the laser is configured to generate a signal comprising a train of pulses at a first frequency.

16. The device of claim 15 wherein the optical signal generator further comprises a modulator configured to reduce the first frequency of pulses to a second frequency of pulses.

17. The device of claim 16 wherein the laser is configured to generate a signal at a frequency of pulses of 10 GHz, and wherein the modulator is configured to reduce that frequency of pulses to 500 MHz.

18. The device of claim 15 wherein the laser is adjustable to vary the frequency of pulses generated by the laser.

19. The device of claim 15 wherein the laser is adjustable to vary a wavelength of the generated optical sampling signal.

20. The device of claim 13 wherein the optical signal generator comprises a second input configured to receive the optical sampling signal from an external source.

21. The device of claim 13 wherein the non-linear optical medium comprises a Highly Non-Linear fibre (HNFL).

22. The device of claim 13 further comprising a filter configured to filter the secondary signal at a filtering wavelength, $\lambda_{FWM}$, substantially equal to a wavelength of a FWM component produced by the interaction of the optical signal and the optical sampling signal.

23. The device of claim 22 wherein the filtering wavelength, $\lambda_{FWM}$, is a wavelength that is substantially equal to a wavelength of an FWM component that is closest to the wavelength of the optical sampling signal.

24. The device of claim 22 wherein the filter comprises a tunable filter configured to select an appropriate wavelength.

25. An oscilloscope comprising:
an optical sampling circuit comprising:
an input configured to receive an optical signal;
an optical signal generator configured to generate an optical sampling signal;
a coupler configured to couple the optical signal received at the input and the optical sampling signal to a non-linear optical medium, such that the optical signal and the optical sampling signal interact in the non-linear optical medium to generate a secondary signal having pulsed components proportional to an instantaneous power of the optical signal;
a detector configured to detect the secondary signal; and
a processor configured to:
determine an order of the pulsed components of the secondary signal that represents a shape of a period of the optical signal; and
re-order the pulsed components by placing the pulsed components in the determined order.

26. A computer readable medium for an optical signal sampling device, the computer readable medium having instructions stored thereon that, when executed by a computer processor, causes the computer processor to:
receive a signal having pulsed components;
receive data on a time period, TS, of an optical signal;
receive data on the time period, TC, of a sampling signal; and
determine an order of the pulsed components which represents a period of the optical signal using the formula, $$t_i = t_0 + \mathrm{Mod}\left[i\frac{(T_S - T_C)}{T_S}\right]$$

where i is the $i^{th}$ pulsed component of the received signal from time, $t_0$.

* * * * *

UNITED STATES PATENT AND TRADEMARK OFFICE
CERTIFICATE OF CORRECTION

PATENT NO. : 7,705,993 B2  Page 1 of 1
APPLICATION NO. : 11/969253
DATED : April 27, 2010
INVENTOR(S) : Bogoni It is certified that error appears in the above-identified patent and that said Letters Patent is hereby corrected as shown below:

In Column 4, Line 12, delete "$t_o.$" and insert -- $t_0.$ --, therefor.

In Column 6, Line 46, in Claim 2, delete "TS" and insert -- $T_S$ --, therefor.

In Column 6, Line 47, in Claim 2, delete "TC" and insert -- $T_C$ --, therefor.

In Column 6, Line 49, in Claim 3, delete "5 $W^{-1} m^{-1}$" and insert -- 5 $W^{-1} km^{-1}$ --, therefor.

In Column 8, Line 41, in Claim 26, delete "TS ," and insert -- $T_S,$ --, therefor.

In Column 8, Line 42, in Claim 26, delete "TC," and insert -- $T_C,$ --, therefor.

Signed and Sealed this

Twenty-sixth Day of October, 2010

David J. Kappos
*Director of the United States Patent and Trademark Office*